United States Patent [19]
McDermott

[11] Patent Number: 5,894,195
[45] Date of Patent: Apr. 13, 1999

[54] ELLIPTICAL AXIAL LIGHTING DEVICE

[76] Inventor: Kevin McDermott, 196 Phillips Dr., Hampstead, Md. 21074

[21] Appl. No.: 08/642,661

[22] Filed: May 3, 1996

[51] Int. Cl.⁶ .................................. H01J 1/62; F21V 7/00
[52] U.S. Cl. ........................ 313/512; 362/311; 362/339; 362/800
[58] Field of Search ........................ 313/110, 113, 313/512; 362/311, 339, 800, 255, 327, 337, 309

[56] References Cited

U.S. PATENT DOCUMENTS

| 1,880,892 | 10/1932 | Dodge | 362/255 |
| 1,977,689 | 10/1934 | Muller | 362/327 |
| 2,215,900 | 9/1940 | Bitner | 362/309 |
| 2,224,178 | 12/1940 | Bitner | 362/337 |
| 2,254,961 | 9/1941 | Harris | 362/327 |
| 2,254,962 | 9/1941 | Harris et al. | 362/327 |
| 2,356,654 | 8/1944 | Cullman | 362/327 |
| 2,362,176 | 11/1944 | Swanson | 313/110 |
| 2,469,080 | 5/1949 | Rosin et al. | 362/327 |
| 4,698,730 | 10/1987 | Sakai et al. | 362/311 |
| 5,140,220 | 8/1992 | Hasegawa | 362/800 |
| 5,452,190 | 9/1995 | Priesemuth | 362/255 |

*Primary Examiner*—Sandra O'Shea
*Assistant Examiner*—Joseph Williams

[57] ABSTRACT

A compact lighting device including a light concentrating reflector directing light emitted by a light source towards a curved light refracting surface where it is refracted and thereby redirected. The light reflecting surface is contoured to direct the reflected light to converge towards one or more points and to additionally converge towards a reference axis. The light refracting surface is contoured and positioned to cooperate with the contour of the light concentrating reflector such that after passing through the refracting surface the emerging light forms a light beam concentrated about the reference axis. An optional light refracting lens can be included to compliment the reflector and refractor combination by redirecting forward light emitted by the light source to further increase the intensity of the concentrated light beam.

18 Claims, 4 Drawing Sheets

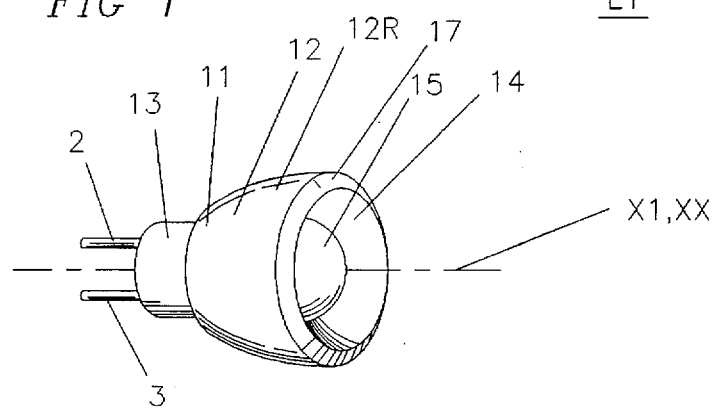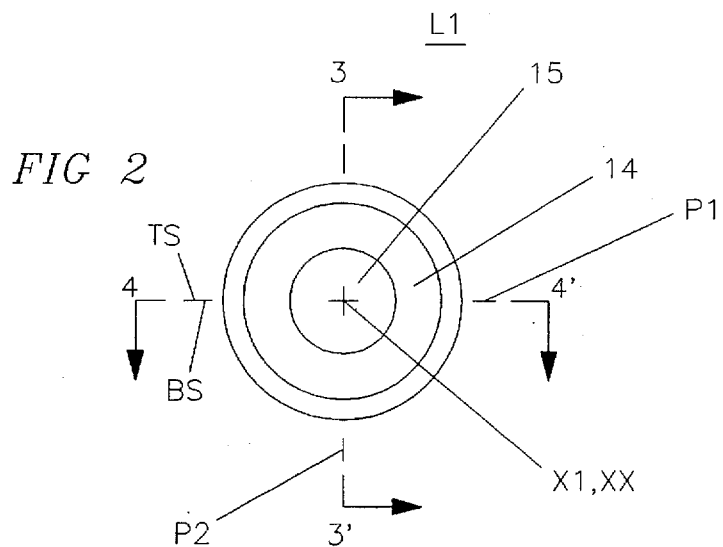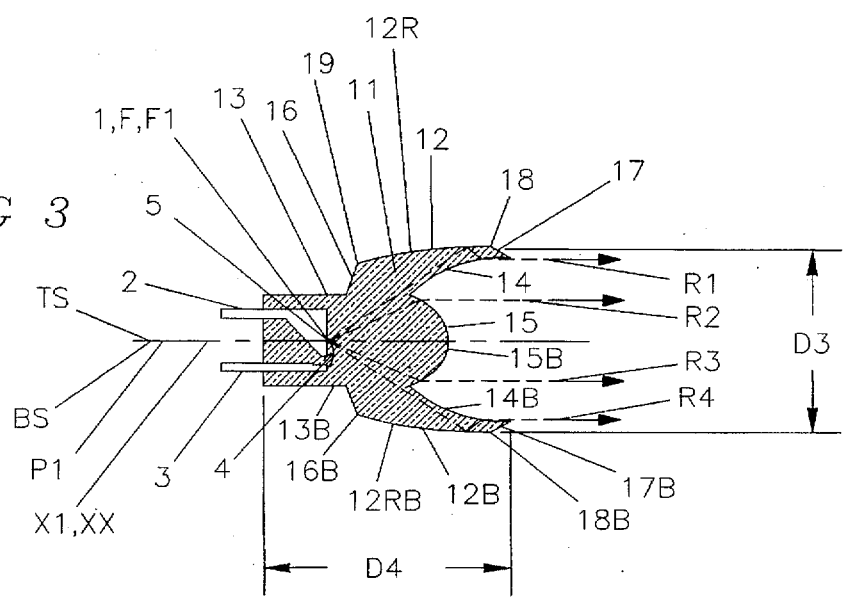

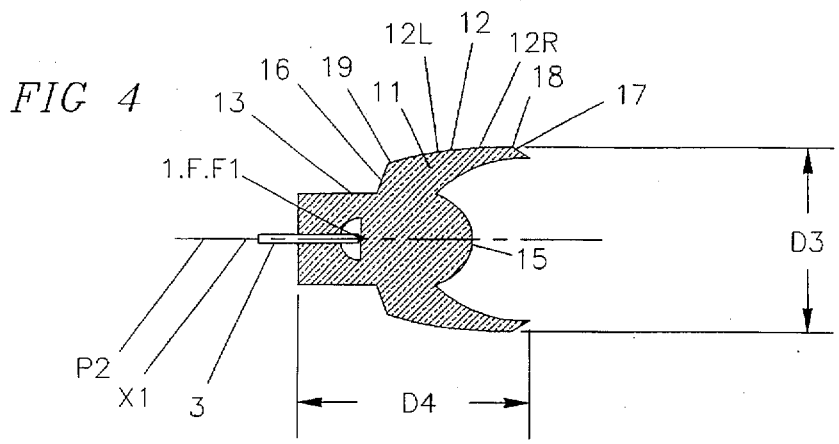
FIG 4
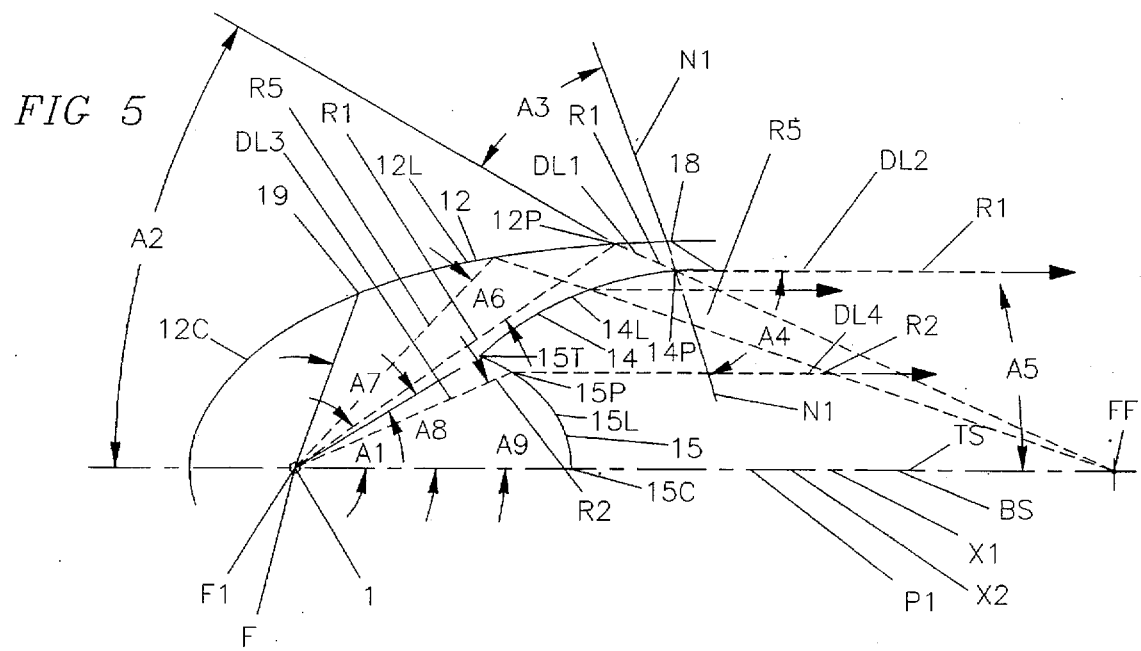
FIG 5
FIG 6

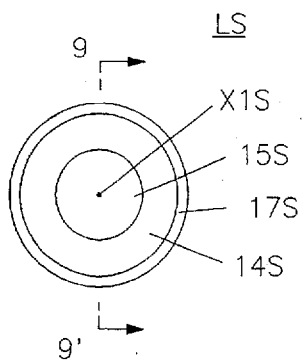
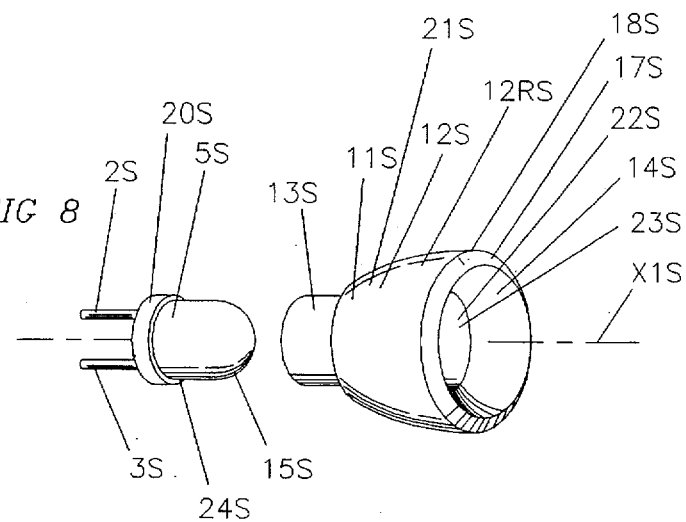
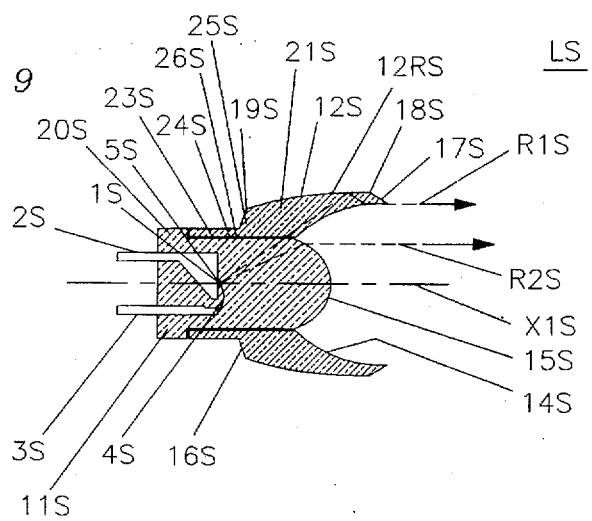
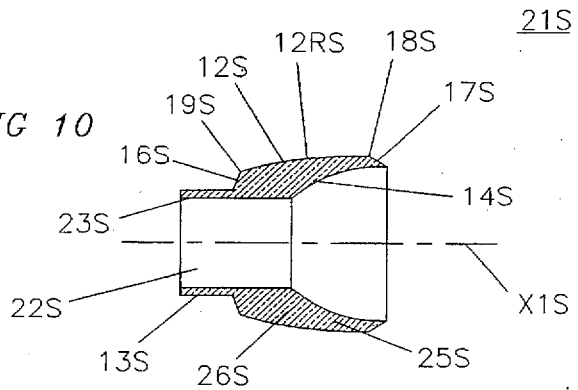

1

ELLIPTICAL AXIAL LIGHTING DEVICE

BACKGROUND OF INVENTION

1. Field of the Invention

The present invention relates to a lighting device which is compact and efficient. It can be employed anywhere a concentrated light beam is necessary. The present invention would typically be used in a flashlight, a caution light, a light source, a reading light, a display or any of a multiplicity of lighting devices.

2. Description of Prior Art

A prior art design can be found in U.S. Pat. No. 4,698,730 issued to Sakai, et al. for a light emitting diode with its principles shown in FIG. 11 of the current application. In the FIG. 11 lighting device LP, light emitting diode (LED) element 1P is mounted at the top of a first lead frame 2P and electrically connected to a second lead 3P by a connecting wire 4P. These elements comprise a typical light emitting diode (LED) light source 5P. As described in the referenced prior art patent LED element 1P emits light forming a spatial radiation pattern that includes both forward and side emitted light. The forward emitted light generally includes light emitted within a range of divergence that includes angles of divergence between 0 and 30 degrees from the optical axis XP of the device. The side emitted light generally includes light emitted within a range of divergence that includes angles of divergence between 30 and 90 degrees from the optical axis XP of the device. In lighting device LP light source 5P is encapsulated in transparent resin 6P. Transparent resin 6P forms two optical light directing surfaces including lens 7P and peripheral reflective surface 8P both of which are symmetrical about axis XP. Both optical surfaces are surfaces of revolution about axis XP. Peripheral reflective surface 8P is a classical parabolic reflector developed about axis XP and shaped to reflect side emitted light to direct it to become parallel to axis XP. As a result of peripheral reflective surface 8P, typical side emitted light ray R1P emitted from LED element 1P intersects peripheral reflective surface 8P and is reflected such that it becomes parallel to axis XP. Planer end portion 9P is perpendicular to reflected light ray R1P and axis XP so planer end portion 9P does not refract reflected light ray R1P or change its direction. Interior wall 10P is parallel to both axis XP and reflected light ray R1P so it also does not refract or redirect light. Lens 7P refracts forward emitted light to direct it to become more parallel to axis XP. As a result of lens 7P, typical forward emitted light ray R2P emitted from LED element 1P intersects lens 7P and is refracted to emerge parallel to axis XP. Lighting device LP has an outside diameter of dimension D1 and a length of dimension D2.

In the referenced prior art design, the side emitted light is not refracted or redirected after its reflection at peripheral reflective surface 8P. Prior art contours and orients peripheral reflective surface 8P so that the reflected light becomes parallel to axis XP. The reflected light leaves the device without redirection through a "planar upper surface". The referenced prior art design functions, however, it represents an unnecessarily large and massive lighting device. The lighting device becomes large because peripheral reflective surface 8P is a parabola contoured to reflect the side light to become parallel to axis XP and also to collect the side light emitted within a wide range of angular divergence from the optical axis XP. The undesirably large size of lighting device LP can be reduced but the available methods result in an unacceptable loss in efficiency. The size of the peripheral reflective surface 8P alone can be reduced by collecting a reduced angular range of side emitted light but because less light is collected, the efficiency of the device will correspondingly be reduced. The size of the entire optical portion of the lighting device LP including the peripheral reflective surface 8P can be proportionally reduced but because LED element 1P will, if it is to maintain its light output maintain its size the ratio of peripheral reflective surface 8P size verses LED element 1P size will be reduced. A reduction in this size ratio reduces the ability of the peripheral reflective surface 8P to accurately redirect the side light resulting one again in a loss in efficiency.

Therefore, in a high efficiency embodiment the referenced prior art design is larger than desired. The large size increases manufacturing costs and due to shrinkage during molding, reduces the precision of the optical surfaces. Furthermore, the larger dimensions of the prior art design require the emitted light to pass through thick sections of transparent resin 6P before exiting the lighting device and consequently experience unacceptable attenuation due to related transmission losses. The large prior art lighting device will also not be acceptable for many uses due to the size limitation of many products.

FIG. 12 also demonstrates an additional advantage of the present invention. Looking at prior art lighting device LP it can be seen that side light emitted by LED element 1 travels a very short distance to a near point NP1 on its reflector while other light emitted by LED element 1 travels over four times that distance to a far point FP1 on the reflector before being reflected. Referring to the present invention lighting device L1 travels a short distance to near point NP2 on its reflector while other light emitted by LED element 1 travels just over two times that distance to far point FP2. The extreme difference between the near and far light paths of prior art lighting device LP makes it difficult for its optical surface to direct the light equally. The short near point NP1 is undesirable because small variations in the peripheral reflector will misdirect the light. If prior art increases the short near point distance the entire device becomes too large very quickly. In the present invention the hear point NP2 distance is at the start longer relative to prior art. Furthermore, due to its size relative to the far point distance, it can be increased without making the lighting device too large.

OBJECT OF THE INVENTION

A main object of the present invention is to provide a lighting device of a more compact design then prior art.

Another object of the present invention is to provide a lighting device with increased efficiency over prior art.

Another object of the present invention is to create a lighting device with reduced size and weight.

Another object of the present invention is to create a lighting device which has reduced mass and which therefore, can be more accurately cast into the precise shape necessary to achieve the highest efficiency of optical design.

Another object of the present invention is to design a light that provides a concentrated beam pattern.

SUMMARY OF THE PRESENT INVENTION

According to the present invention a light source comprising a light emitting diode LED element mounted on a lead frame and encapsulated within a transparent resin has a high percentage of its emitted light collected into a light beam concentrated about a reference axis by a combination of optical surfaces.

The standard light emitting diode element emits light forming a spatial radiation pattern which as described in the referenced prior art can be considered to include a side emitted light zone and a forward emitted light zone. Most of the light energy emitted by the LED element is found within these two zones and the two zones are usually located within a hemisphere. The spatial radiation pattern from a typical LED element is usually substantially symmetrical about a pattern axis. However the present invention will function equally well with a variety of other LED element spatial radiation patterns. Some commercially available LED elements emit light with a spatial radiation pattern shaped such that the direction along the pattern axis represents a direction of high intensity. Other directions which diverge from the pattern axis represent intensities which decrease according to the cosine of the angle of their divergence from the pattern axis. These LED elements do not have a delineation between a forward emitted light zone and a side emitted light zone. Nevertheless, these LED elements also function properly within the present invention.

The transparent resin of the present invention forms three optical surfaces each which alters the direction of the emitted light. Usually each of the optical surfaces is symmetrical about a common reference axis. The first optical surface is a lens which refracts emitted light to direct it to become more parallel to a reference axis of the device. The second optical surface, a reflector means, is a peripheral reflector which reflects and directs emitted light to generally converge towards the reference axis and to intersect the third optical surface, a refractor means. Although the reflector directs the light to generally converge towards the reference axis, it further directs the light to converge towards one or more light concentration points. Generally in the present invention the reflector surface is developed by rotating a line about the reference axis. If the reflector is an elliptical surface the line is an elliptical line curve. The parabolic line curve of the referenced prior art is developed about the axis of revolution. The parabolic reflector surface of prior art is also developed about the axis of revolution. The elliptical line curve of the present invention is developed about two focal points connected by a line. Line curves which are not elliptical in shape can also be employed to construct the peripheral reflector in the present invention.

The refractor means is located to intersect the converging light previously reflected by the second optical surface. In the present invention, the contour of the refractor must be designed to cooperate with the contour of the reflector to redirect the converging light so that it emerges from the lighting device more parallel to the reference axis of the lighting device then it was when it was first emitted from the LED element. The refractor includes a surface which is developed by rotating a curved or bent line about the reference axis.

The reflector (optic 2) and refractor (optic 3) combination of the present invention cooperate to first reflect and direct the light to converge towards the reference axis of the lighting device and then refract and redirect the light to emerge substantially parallel to the reference axis. The combination of two cooperating optics permit the present design to be both more compact and more efficient then prior art.

Generally, if the reflector is elliptical and the output light beam is to be totally parallel the refractor will be a curved surface. The refractor will be developed from a bent line which is curved. If the reflector is a series of connected parabolic surface segments each reflecting light to intersect the reference plane at different angles then the refraction will be a series of corresponding connected non-coliniar straight line segments. The refractor will be developed from a bent line with each of its segments redirecting light reflected by a corresponding parabolic surface segment. Lighting device which use reflectors which are curved or elliptical but which permit output light beams that are not totally parallel can employ a refractor developed by rotating a straight line about a reference axis.

Finally the present invention concentrates the light about a reference axis creating the concentrated beam pattern required by many specifications.

The present design is more compact, more precise and more efficient then prior art. It is also less expensive to produce. These advantages will be apparent from the detailed description of the present invention.

BRIEF DESCRIPTION OF THE DRAWINGS

FIG. 1 is a perspective view of lighting device L1 according to a first embodiment of the present invention.

FIG. 2 is a front view of the FIG. 1 lighting device.

FIG. 3 is a cross-sectional view of the FIG. 2 lighting device taken across line 3—3' of FIG. 2.

FIG. 4 is a cross-sectional view of the FIG. 2 lighting device taken across line 4—4' of FIG. 2.

FIG. 5 is an enlarged diagrammatic line drawing of a portion of the FIG. 3 drawing showing the contour of portions of the reflector, refractor and lens.

FIG. 6 is a perspective view of an alternate embodiment of the lighting device according to the present invention.

FIG. 7 is a front view of the FIG. 6 lighting device.

FIG. 8 is a perspective view of the FIG. 6 lighting device with the light source separated from the sleeve.

FIG. 9 is a cross-sectional view of the FIG. 7 lighting device taken across line 9—9' of FIG. 7.

FIG. 10 is a view of the sleeve removed from the FIG. 9 cross-sectional view.

DETAILED DESCRIPTION

Figure 11:
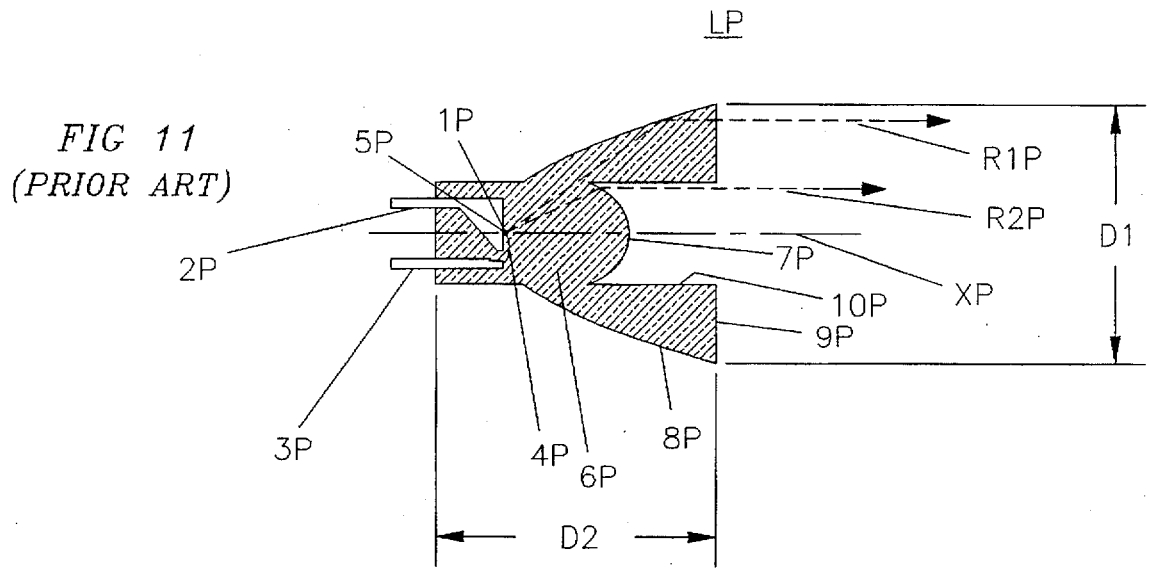
FIG. 11 is a cross-sectional view of lighting device LP detailing a prior art design.

Referring to FIGS. 1 thru 5, a first embodiment of the present invention will be explained hereinafter. FIGS. 1 and 2 are perspective and front views of lighting device L1. FIG. 3 is a sectional view of lighting device L1 taken across line 3—3' of FIG. 2 and FIG. 4 is a sectional view taken across line 4—4' of FIG. 2. Lighting device L1 includes typical LED light source 5 similar to light source 5P previously described in prior art FIG. 11. Looking at FIGS. 3 and 4 of the present application light source 5 includes LED element 1, mounted at the top of a first lead frame 2 and electrically connected to a second lead 3 by a connecting wire 4. Lead frame 2 and lead 3 provide a means to connect a source of electrical power to light source 5. LED element 1 is encapsulated in a light transmitting medium 11. Looking at FIG. 3 on the top side TS of reference plane P1 light transmitting medium 11 is shaped to form reflective surface 12, hub 13, refractive surface 14 and lens 15. Light transmitting medium 11 is usually a resin but can be any of a number of transparent substances including epoxy, acrylic plastic, etc. Rear transition surface 16 connects reflective surface 12 to hub 13 and transition surface 17 connects refractive surface 14 to reflective surface 12. Reflective surface 12 is vacuum metallized with reflective coating 12R to assure the efficient reflection of light. However, even without reflective coating 12R, due to total internal reflection as described in the classical laws of physics much of the light impinging on reflective surface 12 would reflect efficiently. Reflective surface 12 extends from intersection line 18 to intersection line 19. Although not mandatory for all embodiments reflective surface 12, refractive surface 14 and lens 15 are usually symmetrical both about axis X1 and reference plane P1. Looking at FIG. 3 on the bottom side BS of reference plane P1 we see reflective surface 12B, refractive surface 14B, and lens 15B all also formed from light transmitting medium 11. Lighting device L1 is usually symmetrical both about axis X1 and reference plane P1 thus the optical surfaces on the top side TS are equal to those on the bottom side BS. Rear transition surface 16B connects reflective surface 12B to hub 13B and transition surface 17B connects refractive surface 14B to reflective surface 12B. Reflective surface 12B is vacuum metallized with reflective coating 12RB. Reflective surface 12B extends from intersection line 18B to intersection line 19B. LED element 1 is usually coincident with axis X1 and reference plane P1. Axis X1 also known as a central axis, reference axis or optical axis is usually coincident with the pattern axis XX of the spatial radiation pattern of LED element 1.

FIG. 5 is a diagrammatic line drawing showing a portion of the contours of reflective surface 12, refractive surface 14 and lens 15 removed from FIG. 3 all located on the top side TS of reference plane P1. FIG. 5 shows the construction of reflective surface 12 and the path of typical forward and side emitted light rays as they pass through lighting device L1. Side light emitted on the top side TS of reference plane P1, can be considered first side light and side light emitted on the bottom side BS of reference plane P1 can be considered second side light. Elliptical line 12L is the intersection line of reference plane P2 and reflective surface 12. Elliptical line 12L is a segment of a classical two dimensional elliptical line curve 12C developed about focal points F and FF connected by elliptical line axis X2. Reflective surface 12 is an elliptical surface. Reflective surface 12 is developed by rotating elliptical line 12L about axis X1. Axis X1 is coincident with elliptical line axis X2. LED element 1 is at focal point F. LED element 1 can be positioned at other locations relative to focal point F in order to alter the intensity or direction of the beam emerging from lighting device L1. This modification in the location of LED element 1 would still employ the concepts of the present invention.

It should be noted that for the present application a light ray and a reference line both located in a common plane or two light rays in a common plane or a light ray and a plane are never perfectly parallel. They may be extremely close to parallel but upon being infinitely extended in all directions they will eventually intersect to form a very small included angle of intersection. If a light ray is directed to bring towards parallelism that light ray and a line located in a common plane then that light ray or equivalently the directional line indicating the direction along which that light ray proceeds is considered to have been directed to intersect the line at a reduced included angle of intersection. If a light ray is converging towards a line and the light ray is directed to reduce that convergence—or equivalently bring towards parallelism the light ray and the line—then the included angle of intersection between the light ray and the line will be reduced. Similarly if a light ray is diverging from a line and the light ray is directed to reduce that divergence—or equivalently bring towards parallelism the light ray and the line—then the included angle of intersection between the light ray and the line will be reduced. These concepts apply equally when two light rays or a light ray and a plane are considered. Finally, within this application light is to be considered as comprising a multiplicity of typical light rays. Disclosures relating to the path of a light ray which is typical of side emitted light apply to other similar side emitted light rays as well. Additionally disclosures relating to the path of a light ray which is typical of forward emitted light apply to other similar forward emitted light rays as well.

Referring to the present invention and looking especially at FIG. 5, light ray R1 which is typical of side light emitted into reference plane P2 is emitted from LED element 1 diverging from axis X1 and reference plane P1 at angle A1. Light ray R1 intersects reflective surface 12 at elliptical line 12L at point 12P where it is reflected. According to basic optics with an elliptical reflector shaped according to elliptical line 12L light ray R1 is directed to converge towards focal point FF and elliptical line axis X2. Focal point FF can be considered the light concentration point since the light refracted at line 12L is directed to pass thru it. Since elliptical line axis X2 is coincident with both axis X1 and reference plane P1 reflected light ray R1 will additionally converge towards or about both axis X1 and reference plane P1. Reflected light ray R1 proceeds along a direction identified by a directional line DL1 passing through focal point FF and point 12P. If extended directional line DL1 would intersect both axis X1 and reference plane P1 forming an angle of intersection A2. Reflected light ray R1 has additionally through reflection been directed to intersect refractive surface 14 at point of intersection 14P. It also intersects the normal line N1 to refractive surface 14 at point 14P to form angle of intersection A3. According to Snells law of optics light ray R1 will at point 14P be refracted and redirected to emerge from refractive surface 14 at a determined angle A4 relative to normal line N1. The exact angle of intersection A3 between normal line N1 and reflected light ray R1 will establish both angle A4 and the geometrical relationship between refracted light ray R1 and axis X1. Refracted light ray R1 will after refraction proceed along a new directional line DL2 which upon being infinitely extended will intersect axis X1 or reference plane P1 to form angle of intersection A5 which, due to the construction of lighting device L1 is less than angle of intersection A2. Thus, refractive surface 14 has reduced the convergence of reflected light ray R1 relative to axis X1. It has reduced the angle of intersection from a magnitude equal to that of angle of intersection A2 to a magnitude equal to that of angle of intersection A5. Angle A5 is also less than angle A1 thus the combination of reflective surface 12 and refractive surface 14 has also reduced the divergence of light ray R1 about axis X1. Reflective surface 12 and refractive surface 14 have cooperated to bring light ray R1 towards parallelism with reference plane P1. Since light ray R1 is typical of side emitted light other similar side emitted light will also have its divergence about axis X1 reduced.

Reflective surface 12 has directed light ray R1 to converge towards axis X1 and in FIG. 5 it would, if not redirected by refractive surface 14, intersect axis X1. It is possible in the present invention that light ray R1 converge about towards axis X1, but not, if permitted to continue along its directional line actually intersect axis X1. Within this description of the present invention the word converge means to move towards but it does not require intersection.

Many applications require a high intensity concentrated output light beam and embodiments of the present invention for those applications will configure refractive surface 14 so that refracted light ray R1 emerges from refractive surface 14 substantially parallel to axis X1, with angle of intersection A5 substantially equal to zero degrees. This embodiment is shown in FIG. 5 wherein the curvature of refractive surface 14 is calculated to make angle A5 substantially equal to zero degrees using the index of refraction for light transmitting medium 11 and the basic laws of optics. Other applications not requiring a high intensity light beam but needing a wide beamspread may employ embodiments which configure refractive surface 14 to increase the concentration of light about axis X1 but not attempt to make the light totally parallel. These embodiments will configure refractive surface 14 to bring towards parallelism refracted light ray R1 and axis X1. However, they will not attempt to bring all the way to parallelism light ray R1 and axis X1. The concentration of the emerging light beam can alternatively be modified by changing the shape of reflective surface 12.

In FIG. 5 line 14L is formed at the intersection of reference plane P2 and refractive surface 14. Line 14L is bent and usually concave. It can be gradually curved as shown in FIG. 5 to cooperate with an elliptical reflector or formed by two or more non-coliniar line segments which are straight to cooperate with a segmented parabolic reflector. The exact refractor contour is determined using classical lens design techniques employing Snells law of optics such that its contour cooperates with reflective surface 12 and the other parameters of the present embodiment to refract the reflected light such that it emerges from lighting device L1 substantially parallel to axis X1. Employing a bent line 14L to develop refractive surface 14 permits lighting device L1 to be reduced in size. Refractive surface 14 is normally concave in shape. It is developed by rotating line 14L about axis X1.

Referring again to FIG. 5, light ray R5 which was not shown in FIG. 3 represents a second typical light ray of side light emitted by LED element 1. Light ray R5 diverges from light ray R1 by angle A6. According to the same principles as previously described for light ray R1, light ray R5 is first reflected to converge towards focal point FF and then refracted to emerge substantially parallel to axis X1. This makes refracted light ray R5 substantially parallel to refracted light ray R1. Therefore, lighting device L1 has redirected both light ray R1 and light ray R5 to reduce the divergence between these light rays or to bring them towards parallelism.

If refractive surface 14 were not included in the design or if no refraction took place at point of intersection 14P then reflected light ray R1 would converge upon and intersect axis X1 forming angle of intersection A2. The present invention includes refractive surface 14 to reduce the angle of intersection A2 between reflected light ray R1 and axis X1. Refractive surface 14 could also be considered as functioning to reduce the convergence of reflected light ray R1 about axis X1. Refractive surface 14 could also be considered as functioning to bring towards parallelism reflected light ray R1 and other side emitted light rays similar to light ray R1.

Looking again especially at FIG. 5 light ray R1 is typical of the side emitted light from light source 5. Side emitted light ray R1 in FIG. 5 is emitted from light source 5 diverging at angle A1 from both axis X1 and reference plane P1. For the present embodiment in which axis X1 is coliniar with the pattern axis of LED element 1 light emitted by LED element 1 within angle A7 in all rotational directions about axis X1 represents the side emitted light. Side emitted light generally includes the light emitted by light source 5 within angle A7 relative to axis X1 as shown in FIG. 5 and it is typically reflected along elliptical line 12L between intersection line 18 and intersection line 19. For the FIG. 5 embodiment angle A7 has a magnitude of approximately 40 degrees. However, the magnitude of the angle representing the side emitted light can be changed to comply with particular design parameters.

Referring to FIG. 3, it should be noted that light ray R1 is on the top side TS of reference plane P1. Light ray R1 is reflected by reflective surface 12 at point 12P then refracted by refractive surface 14 at point of intersection 14P all of which are also on the same top side TS of reference plane P1. It can be seen that a similar relationship exists among the bottom side BS of reference plane P1, second typical side emitted light ray R4, its intersection point on refractive surface 14B and its intersection point on reflective surface 12B. Lighting device L1 is symmetrical about reference plane P1. Light ray R4 is typical of second side emitted light. The optics on both sides of reference plane P1 are identical and, therefore, function identically. Generally, light ray R4 is directed in a like fashion as that described for light ray R1. Since both light ray R1 and light ray R4 are brought towards parallelism with axis X1, it can be easily seen that they are brought towards parallelism with each other. Actually, the present design brings towards parallelism all of the side emitted light as seen in FIG. 5 as typified by light rays R1, R4, and R5.

The present embodiment is symmetrical about axis X1 with the optical contours identical about axis X1. Alternate designs of the present invention could have optical contours which are not symmetrical about axis X1 and still employ the concepts of the present invention.

Forward emitted light as seen in FIG. 5 generally includes light emitted by light source 5 within angle A8 about axis X1 and is typically refracted by lens 15. Angle A8 extends from the center point 15C of lens 15 on axis X1 to the top point 15T of lens 15. For the present embodiment light emitted by LED element 1 within angle A8 in all rotational directions about axis X1 represents the forward emitted light. Angle A8 for the present embodiment is approximately 30 degrees. The magnitude of the angle representing the forward emitted light can be changed to comply with particular design requirements. Light ray R2 which is typical of forward emitted light as seen in FIG. 5 emerges from LED element 1 diverging at angle A9 relative to axis X1. Forward emitted light ray R2 proceeds along directional line DL3 and intersects lens 15 at point 15P along lens contour line 15L where it is refracted. Lens contour line 15L is formed at the intersection of lens 15 and reference plane P2. Lens 15 is developed by rotating lens contour line 15L about axis X1. In the present embodiment lens 15 is aspheric and LED element 1 is at focal point Fl of lens 15 so that refracted light ray R2 emerges substantially parallel to axis X1. Refracted light ray R2 proceeds along directional line DL4 which is substantially parallel to axis X1. Alternate embodiments may require a less intense but larger beamspread. In these alternate embodiments, the contour of lens 15 can be altered or the location of LED element 1 relative to focal point F1 can be shifted to alter the refraction of light ray R2 such that the refraction at lens 15 reduces the divergence of light ray R2 about axis X1 but does not attempt to make light ray R2 parallel to axis X1.

Light ray R2 is refracted by lens 15 at point 15P both which are on a first or top side TS of reference plane P1. Referring to FIG. 3, it can be seen that a similar relationship exists among a second or bottom side BS of reference plane P1, second typical forward emitted light ray R3 and its intersection point on lens 15. Lighting device L1 is symmetrical about axis X1 and reference plane P1. Hence, the optics about reference plane P1 function identically on both sides of reference plane P1. The optics also function identically for all rotational directions about axis X1. Therefore, light ray R3 is directed in a like fashion to that described for light ray R2. Since both light ray R2 and light ray R3 are brought towards parallelism with axis X1, it can be easily seen that they are brought towards parallelism with each other. Since as previously described the side light is brought towards parallelism with axis X1 it is further easily seen that the forward emitted light is brought towards parallelism with the side emitted light. Actually, as seen in FIG. 5 the design brings towards parallelism all of the forward emitted light emitted within angle A7. The FIG. 5 embodiment is symmetrical about axis X1. However, alternate designs of the present invention could have different optical contours about axis X1 and still employ the concepts of the present invention. Light rays R2 and R3 are typical of forward emitted light emitted from LED element 1. Other forward emitted light would be directed similarly by lens 15.

Referring back to FIGS. 4 and 5 and the side emitted light previously described. Light ray R1 can optionally be considered to represent a first portion of the side light and light ray R4 can optionally be considered to represent a second portion of the side light. Each of these light rays is diverging from axis of revolution X1 such that they form an angle of intersection A1 with axis of revolution X1 and reference plane P1. Angle A1 exceeds angle A8 which is 30 degrees. Thus light rays R1 and R4 are diverging from each other such that they form an angle of intersection which exceeds 60 degrees and the optics of lighting device L1 directs both light ray R1 and light ray R4 to reduce this divergence. Other embodiments of the lighting device can incorporate the present invention even if they do not bring towards parallelism all portions of the side light, however, the efficiency of the lighting device is generally improved by collecting and directing as much of the side light as possible.

An alternate embodiment of the present invention is disclosed in FIGS. 6 thru 10. FIGS. 6 and 7 are perspective and front views of sleeve lighting device LS. FIG. 8 is a perspective view of sleeve lighting device LS with its LED lamp 20S removed. FIG. 9 is a sectional view of sleeve lighting device LS taken across line 9–9' of FIG. 7. FIG. 10 is a drawing of the sleeve 21S removed from the FIG. 9 drawing. Sleeve lighting device LS functions optically comparably to lighting device L1 of FIG. 1. However, sleeve lighting device LS is manufactured by assembling a LED lamp 20S and sleeve 21S rather than the unitized design as described for lighting device L1. Its optics are symmetrical about axis X1S and they direct light ray R1S and R2S exactly as lighting device L1 directed light rays R1 and R2. There are numerous ways to manufacture the present invention in which its light source, reflector, refractor and optional lens are combined. Sleeve lighting device LS is one of these numerous ways to manufacture the present invention, however, other embodiments which use the optical concepts herein disclosed are also to be considered as employing the present invention. Many of the elements of sleeve lighting device LS function optically the same as the corresponding elements found in lighting device L1. Therefore in order to simplify the explanation of lighting device LS for those corresponding elements the suffix S has been added to the drawing designations found in FIGS. 1 thru 5 relating to lighting device L1. Elements of lighting device LS which were not part of lighting device L1 are given new numerical designations, however, they also include the suffix S.

Lighting device LS is especially useful because it employs a commercially available type T 1¾ LED lamp 20S that is obtainable in a variety of colors and electrical characteristics. Hewlett Packard™ part number HLMA-DL00 is typical of the many commercial LED lamps that can be used as LED lamp 20S. Other LED lamps such as that shown in the referenced prior art U.S. Pat. No. 4,698,730 issued to Sakai, et al. which emit light with a spatial radiation pattern as shown in FIG. 9 of that patent are also acceptable.

Referring now to FIGS. 6 thru 10 but especially FIG. 8 which is a disassembled perspective view of sleeve lighting device LS, sleeve lighting device LS is comprised of LED lamp 20S and sleeve 21S. Sleeve 21S includes a hollow opening 22S enclosed by a wall 23S. LED lamp 20S is assembled into hollow opening 22S to create sleeve lighting device LS. FIGS. 6 and 7 show perspective and front views of the assembled sleeve lighting device LS. FIG. 9 is a sectional view of sleeve lighting device LS taken across line 9–9' of FIG. 7. Referring to FIG. 9 LED lamp 20S comprises light source 5S. Light source 5S includes LED element 1S mounted at the top of a first lead frame 2S and electrically connected to a second lead 3S by a connecting wire 4S. LED element 1S is coincident with axis X1S. Light emitting element 1 is encapsulated in a lamp light transmitting medium 11S which forms lamp body 24S and lens 15S. Lamp light transmitting medium 11S is usually a clear transparent resin but can be any of a number of substances including epoxy, acrylic plastic, etc.

Referring to FIG. 10 which is a drawing of sleeve 21S removed from the FIG. 9 drawing, sleeve 21S is manufactured of a sleeve light transmitting medium 25S usually of the same substance as lamp light transmitting medium 11S. Generally, if sleeve light transmitting medium 25S is of a different material then lamp light transmitting medium 11S it is desirable, in order to reduce unwanted refraction, that their indices of refraction remain substantially equal. Sleeve light transmitting medium 25S is formed to comprise reflective surface 12S, hub 13S refractive surface 14S. Rear transition surface 16S connects reflective surface 12S and hub 13S and transition surface 17S connects refractive surface 14S to reflective surface 12S. Reflective surface 12S is metallized with reflective coating 12RS to assure the efficient reflection of light. Reflective surface 12S extends from intersection line 18S to intersection line 19S. Reflective surface 12S and refractive surface 14S are symmetrical about reference plane P1. Hollow opening 22S is formed by wall 23S. Sleeve 21S is symmetrical about reference plane P1. During assembly LED lamp 20S is inserted into hollow opening 22S. Wall light transmitting medium 26S with an index of refraction exceeding 1.1 is usually placed between lamp body 24S and wall 23S. Wall light transmitting medium 26S can be any of a number of transparent substances including epoxy, acrylic plastic, etc. The index of refraction of wall light transmitting medium 26S is generally selected to substantially equal the index of refraction of sleeve light transmitting medium 25S to reduce unwanted refraction. Once assembled lighting device LS optically functions comparably to lighting device L1 as previously described.

Figure 12:
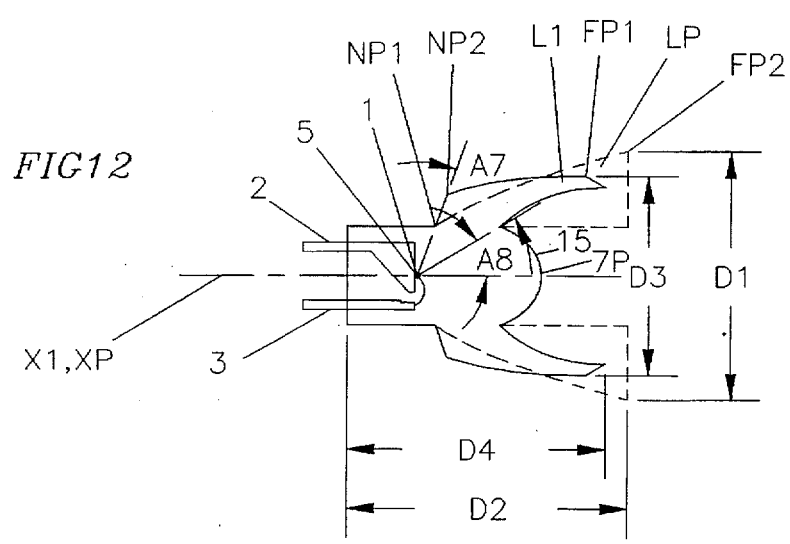
FIG. 12 is a diagrammatic solid line drawing of the FIG. 3 drawing contour overlaying a diagrammatic dashed line drawing of the prior art FIG. 11 drawing contour.

FIG. 12 shows the present design represented by lighting device L1 using solid lines overlaying the referenced prior art design represented by lighting device LP from FIG. 11 using dotted lines. Both designs are configured to collect equal amounts of forward emitted light represented by angle A8. Also both designs are configured to collect equal amounts of side emitted light represented by angle A7. It can be seen from FIG. 12 that dimensions D1 and D2 for prior art lighting device LP are both larger then the corresponding dimensions D3 and D4 of lighting device L1 of the present invention. The reduced size of lighting device L1 makes it less expensive to manufacture and more precise when casting. The increased precision of the optical surfaces of lighting device L1 permit it to more accurately direct the light resulting in improved efficiency.

FIG. 12 also demonstrates an additional advantage of the present invention. Looking at prior art lighting device LP it can be seen that side light emitted by LED element 1 travels a very short distance to a near point NP1 on its reflector while other light emitted by LED element 1 travels over four times that distance to a far point FP1 on the reflector before being reflected. Referring to the present invention lighting device L1 light travels a short distance to near point NP2 on its reflector while other light emitted by LED element 1 travels just over two times that distance to far point FP2. The extreme difference between the near and far light paths of prior art lighting device LP makes it difficult for its optical surface to direct the light equally. The short near point NP1 is undesirable because small variations in the peripheral reflector will misdirect the light. If prior art increases the short near point distance the entire device becomes too large very quickly. In the present invention the near point NP2 distance is at the start longer relative to prior art. Furthermore, due to its size relative to the far point distance, it can be increased without making the lighting device too large.

Having now fully set forth the preferred embodiments and certain modifications of the concept underlying the present invention, various other embodiments as well as certain variations and modifications of the embodiment herein shown and described will obviously occur to those skilled in the art upon becoming familiar with said underlying concept. For instance, although this disclosure centered on visible light, the concepts described and the term light are meant to include all electromagnetic radiated energy including the infrared portion of the spectrum.

Also, although this disclosure incorporated a LED light source which, because of its spatial radiation pattern is uniquely suited for the present invention the concepts disclosed can also be applied using an incandescent light source.

It is to be understood, therefore, that within the scope of the appended claims, the invention may be practiced otherwise than as specifically set forth herein.

What is claimed is:

1. A lighting device including:

a light source;

a source of electrical power;

said light source further including a light emitting diode element;

said light emitting diode element coincident with a reference axis;

a connecting means for connecting said source of electrical power to said light source;

said light emitting diode element emitting a side light having a side divergence about said reference axis;

a reflective surface connected to said light source disposed intersecting said side light, said reflective surface comprising a substantially elliptical line, said substantially elliptical line having an elliptical line axis, said elliptical line axis substantially parallel to said reference axis, said reflective surface including a reflecting means for forming a reflected light having a convergence about said reference axis; and a refractive surface connected to said reflective surface disposed intersecting said reflected light, said refractive surface including a refracting means for bringing said reflected light towards parallelism with said reference axis.

2. A lighting device including:

a light source;

a source of electrical power;

said light source further including a light emitting diode element;

said light emitting diode element coincident with a reference axis;

a connecting means for connecting said source of electrical power to said light source;

said light emitting diode element emitting a side light having a side divergence about said reference axis;

said light emitting diode element encapsulated in a lamp light transmitting medium, said lamp light transmitting medium comprising a resin having an index of refraction exceeding 1.1;

a reflective surface connected to said light source disposed intersecting said side light, said reflective surface comprising a substantially elliptical line, said substantially elliptical line having an elliptical line axis, said elliptical line axis substantially parallel to said reference axis, said reflective surface including a reflective means for forming a reflected light having a convergence about said reference axis; and a refractive surface connected to said reflective surface disposed intersecting said reflected light, said refractive surface including a refracting means for bringing said reflected light towards parallelism with said reference axis.

3. A lighting device including:

a light source;

a source of electrical power;

said light source further including a light emitting diode element;

said light emitting diode element coincident with a reference axis;

a connecting means for connecting said source of electrical power to said light source;

said light emitting diode element emitting a side light having a side divergence about said reference axis;

said light emitting diode element encapsulated in a lamp light transmitting medium, said lamp light transmitting medium comprising a resin having an index of refraction exceeding 1.1;

a refractive surface;

a reflective surface;

said lamp light transmitting medium forming said reflective surface and said refractive surface;

said reflective surface connected to said light source disposed intersecting said side light, said reflective surface comprising a substantially elliptical line, said substantially elliptical line having an elliptical line axis, said elliptical line axis substantially parallel to said reference axis, said reflective surface including a reflective means for forming a reflected light having a convergence about said reference axis; and said refractive surface connected to said reflective surface disposed intersecting said reflected light, said refractive surface including a refractive means for bringing said reflected light towards parallelism with said reference axis.

4. A lighting device including:

a light source;

a source of electrical power;

said light source further including a light emitting diode element;

a connecting means for connecting said source of electrical power to said light source;

said light emitting diode element coincident with a reference axis and emitting a forward light having a forward divergence about said reference axis;

said light emitting diode element encapsulated in a lamp light transmitting medium, said lamp light transmitting medium comprising a resin having an index of refraction exceeding 1.1;

a lens surface;

said lens surface formed of said lamp light transmitting medium and disposed about said light source intersecting said forward light, said lens surface including a lens means for refracting and bringing said forward light towards parallelism with said reference axis;

said light emitting diode element further emitting a side light having a side divergence about said reference axis;

said side divergence larger than said forward divergence;

a reflective surface connected to said light source disposed intersecting said side light, said reflective surface comprising a substantially elliptical line, said substantially elliptical line having an elliptical line axis, said elliptical line axis substantially parallel to said reference axis, said reflective surface including a reflective means for forming a reflected light having a convergence about said reference axis; and a refractive surface connected to said reflective surface and disposed intersecting said reflected light, said refractive surface including a refractive means for bringing said reflected light towards parallelism with said reference axis.

5. A lighting device including:

a light source;

a source of electrical power;

said light source further including a light emitting diode element;

said light emitting diode element coincident with a reference axis;

a connecting means for connecting said source of electrical power to said light source;

said light emitting diode element emitting a side light having a side divergence about said reference axis;

said light emitting diode element encapsulated in a lamp light transmitting medium, said lamp light transmitting medium comprising a resin having an index of refraction exceeding 1.1;

a refractive surface;

a reflective surface;

a sleeve means formed of a sleeve light transmitting medium;

said sleeve means comprising said refractive surface and said reflective surface, said sleeve means further comprising a wall forming a hollow portion, said hollow portion receiving said light source;

said reflective surface connected to said light source disposed intersecting said side light, said reflective surface comprising a substantially elliptical line, said substantially elliptical line having an elliptical line axis, said elliptical line axis substantially parallel to said reference axis, said reflective surface including a reflective means for forming a reflected light having a convergence about said reference axis; and said refractive surface connected to said reflective surface disposed intersecting said reflected light, said refractive surface including a refractive means for bringing said reflected light towards parallelism with said reference axis.

6. A lighting device including:

a light source;

a source of electrical power;

said light source further including a light emitting diode element;

said light emitting diode element coincident with a reference axis;

a connecting means for connecting said source of electrical power to said light source;

said light emitting diode element emitting a side light having a side divergence about said reference axis;

a reflective surface formed of a rotary movement of a substantially elliptical line about said reference axis;

said reflective surface connected to said light source disposed intersecting said side light, said substantially elliptical line having an elliptical line axis, said elliptical line axis substantially coincident with said reference axis, said substantially elliptical line having a focal point, said light emitting diode element located substantially at said focal point; and a refractive surface connected to said reflective surface disposed intersecting said reflected light, said refractive surface including a refractive means for bringing said reflected light towards parallelism with said reference axis.

7. The lighting device according to any of claims 1, 2, 3, 5 or 6 which further includes:

a lens surface;

said light emitting diode element further emitting a forward light having a forward divergence about said reference axis;

said forward divergence less than said side divergence; and said lens surface formed of a light transmitting medium connected to said light source and disposed about said light source intersecting said forward light, said lens surface including a lens means for refracting said forward light and reducing said forward divergence of said forward light about said reference axis.

8. The lighting device according to any of claims 1, 2, 3 or 6 which further includes:

a sleeve means formed of a sleeve light transmitting medium; and said sleeve means comprising said refractive surface and said reflective surface, said sleeve means further comprising a wall forming a hollow portion, said hollow portion receiving said light source.

9. The lighting device according to any of claims 1, 2, 3 or 6 which further includes:

a lens surface;

said light emitting diode element further emitting a forward light having a forward divergence about said reference axis;

said forward divergence smaller than said side divergence;

said lens surface formed of a light transmitting medium coupled to said light source and disposed intersecting said forward light, said lens surface including a lens means for refracting said forward light and reducing said forward divergence about said reference axis;

a sleeve means formed of a sleeve light transmitting medium;

said sleeve means comprising said refractive surface and said reflective surface, said sleeve means further comprising a wall forming a hollow portion, said hollow portion receiving said light source; and, a wall light transmitting medium with an index of refraction exceeding 1.1 between said wall and said light source.

10. The lighting device according to any of claims 1 thru 5 which further includes:

said reflective surface formed of a rotary movement of said substantially elliptical line about said reference axis.

11. The lighting device according to any of claims 1 thru 5 which further includes:

said reflective means comprising said substantially elliptical line having a focal point and said light emitting diode element located substantially at said focal point.

12. The lighting device according to any of claims 1 thru 6 which further includes:

said refractive means additionally for bringing said reflected light approximately to parallelism.

13. A lighting device according to any of claims 1 thru 6 which further includes:

said refractive means comprising said refractive surface having a concave contour.

14. A lighting device according to any of claims 1 thru 6 which further includes:

said refractive surface formed of a rotary movement of a line about said reference axis, said line intersecting said reference axis forming an acute angle.

15. A lighting device according to any of claims 1 thru 6 which further includes:

said refractive means comprising said refractive surface formed of a rotary movement of a curved line approximately about said light emitting diode element.

16. A lighting device according to any of claims 1 thru 5 which further includes:

said elliptical line axis additionally coincident with said reference axis.

17. A lighting device according to any of claims 1, 2 or 4 which further includes:

said reflective surface and said refractive surface formed of a light transmitting medium having an index of refraction exceeding 1.1.

18. A lighting device according to claim 4 which further includes:

said lens means comprising said lens surface having a substantially aspheric contour.

* * * * *